United States Patent

McCullough et al.

[11] Patent Number: 6,127,038
[45] Date of Patent: Oct. 3, 2000

[54] PRINTED CIRCUIT BOARD COATING AND METHOD

[75] Inventors: Randy L. L. McCullough, Charleston; John Lee Wayt, St. Albans; James N. Butch, Charleston, all of W. Va.

[73] Assignee: American Meter Company, Scott Depot, W. Va.

[21] Appl. No.: 08/988,760

[22] Filed: Dec. 11, 1997

[51] Int. Cl.[7] .................................................. B32B 15/08
[52] U.S. Cl. ......................... 428/416; 428/414; 428/901; 361/762; 257/687
[58] Field of Search .................................. 257/687, 658; 428/411, 414, 416, 901; 361/762

[56] References Cited

U.S. PATENT DOCUMENTS

| | | | |
|---|---|---|---|
| 4,278,707 | 7/1981 | Biran | 427/96 |
| 4,490,496 | 12/1984 | Maekawa et al. | 524/317 |
| 4,698,240 | 10/1987 | Ono et al. | 427/58 |
| 4,830,922 | 5/1989 | Sparrowhawk et al. | 428/411.1 |
| 4,839,642 | 6/1989 | Batz et al. | 340/825.54 |
| 5,061,776 | 10/1991 | Weaver et al. | 528/66 |
| 5,153,986 | 10/1992 | Brauer et al. | 427/97 |
| 5,326,589 | 7/1994 | Okinoshima et al. | 427/79 |
| 5,336,928 | 8/1994 | Neugebauer et al. | 257/700 |
| 5,409,733 | 4/1995 | Boger et al. | 427/96 |
| 5,443,672 | 8/1995 | Stoll et al. | 156/244.17 |
| 5,460,767 | 10/1995 | Sanftelben et al. | 264/263 |
| 5,510,138 | 4/1996 | Sanftleben et al. | 427/96 |
| 5,543,008 | 8/1996 | Hidber et al. | 156/229 |

*Primary Examiner*—Cathy F. Lam
*Attorney, Agent, or Firm*—Rhodes & Mason, P.L.L.C.

[57] ABSTRACT

A conformal coating and method for applying same to a printed electrical circuit board, components and leads for providing corrosion resistance. In a preferred embodiment, the conformal coating comprises a first coating layer of parylene which is vacuum deposited and removably bonded onto an ultra-clean surface of a printed circuit board including attached components and leads. Additionally, a second coating layer of a corrosion inhibiting viscous fluid is deposited onto the first coating layer to form a continuous, stratified, conformal coating which is sealed and corrosion resistant.

22 Claims, 1 Drawing Sheet

PRINTED CIRCUIT BOARD COATING AND METHOD

FIELD OF THE INVENTION

The present invention relates generally to a conformal coating and methods for conformally coating a substrate to provide corrosion resistance, and more particularly, to a conformal coating and method for conformally coating printed electrical circuit boards and the components mounted thereto to provide corrosion resistance.

BACKGROUND OF THE INVENTION

Low power, battery operated environments present an environment where electronics are more susceptible to humidity-induced environmental changes. A particularly acute need exists in commercial utility meters such as natural gas meters, water meters or electric meters. Such applications are exposed to temperature extremes of −40° F. to 160° F., in varying humidity conditions, and sometimes even immersed in water. Additionally, battery life in such commercial utility meters must extend to 10 or more years in certain applications. Given the low power environment inherent in extended battery life applications, the electronics are configured to periodically awaken from an ultra-low power idle state for processing.

The electronics are implemented on printed circuit boards having electronic components such as integrated circuits, crystals, inductors, batteries resistors, capacitors, diodes, transistors, switches and sockets. Each of these components has leads which mount to the surface of the printed circuit board, as in surface mount applications, or extend through the circuit board as in traditional thru-hole applications. Conformal coatings for printed electrical circuit boards, including the components and the associated leads, and techniques for coating the same have been used to prevent corrosion and shorting from exposure to humid conditions. However, many conformal coatings, in particular, the widely used acrylic-based coatings, often delaminate or pull away from the corners of leads and boards and develop cracks which wick moisture during temperature and humidity cycles. These cracks and areas of delamination form pockets which may entrap water and dissolve and/or disassociate contaminants confined therein. These contaminants may eventually form dendritic growths between component leads, which lead to shorts, excessive power consumption and board malfunctions. These problems are exacerbated in low power, battery operated environments where moisture and dendritic formations between leads project a relatively low impedance, with respect to the high impedance battery application.

Therefore, there remains a need for a conformal coating for printed circuit boards which will provide moisture and corrosion resistance for the printed circuit boards and the components mounted thereto without cracking or delaminating.

SUMMARY OF THE INVENTION

The present invention provides circuit boards and their associated components with a protective conformal coating, which is sealed and corrosion resistant, thus eliminating cracks and spaces that would result from incomplete coating coverage or delamination and the influx of water and contaminants that can cause shorting and corrosion of leads. This allows indefinite operation of low-powered electronics in varying moisture environments, or even submerged in water.

The present invention is directed to a protective conformal coating and method for applying the same to printed circuit boards and the components thereon to provide a corrosion resistant, sealed, stratified coating which eliminates cracks and delamination, thereby providing corrosion and moisture resistance when exposed to humid conditions. Further, the present invention provides a protective conformal coating for circuit boards which allows for repair and reapplication or recovering of the board, components, and component leads.

Preferably, the protective conformal coating comprises a first coating layer of a material selected from the group mainly consisting of parylene, urethane, acrylics, epoxies and silicones which is deposited onto an ultra-clean printed circuit board having a multiplicity of components. Although all of these conformal coating materials are believed acceptable substitutes for the first coating, preferably, parylene is used for the first coating.

Typically, the ultra-clean circuit board is cleaned to approximately about less than 20 micrograms per square inch NaCl equivalent. For best results, the printed circuit board is cleaned to approximately about less than 5 micrograms per square inch NaCl equivalent. The parylene or equivalent coating which is deposited on the ultra-clean circuit board provides a bonded coating that will not delaminate from the printed circuit board, the mounted components or the component leads. It is important that the first coating layer is deposited to cover most, if not all, of the exposed surfaces of the board, components and leads. Care should be taken to coat between and behind lead surfaces. Further, the first coating layer of parylene is removable and redepositable, thereby allowing for board repair and recoating, as necessary.

Typically, the protective conformal coating further comprises a second coating layer comprising a corrosion inhibiting viscous fluid applied onto the first coating layer, thereby filling in gaps and flexible openings occurring in the first coating layer. The corrosion inhibiting lubricant is capable of withstanding corrosive environments and provides a sealed, stratified coating. Like the first coating, the second coating should cover most, if not all, of the printed circuit board, components and lead surfaces. Where the first coating layer is removed and reapplied, the second coating layer of corrosion inhibiting viscous fluid is also reapplied to reseal the printed circuit board, components, and leads.

Accordingly, one aspect of the present invention is to provide a protective conformal coating for a substrate which is corrosion resistant. It is another aspect of the present invention to provide a conformally coated printed circuit board, including components and leads, which is sealed and corrosion resistant. Still another aspect of the present invention is to provide a method for conformally coating a printed circuit board, including components and leads.

DETAILED DESCRIPTION OF THE PREFERRED EMBODIMENT

Figure 1:
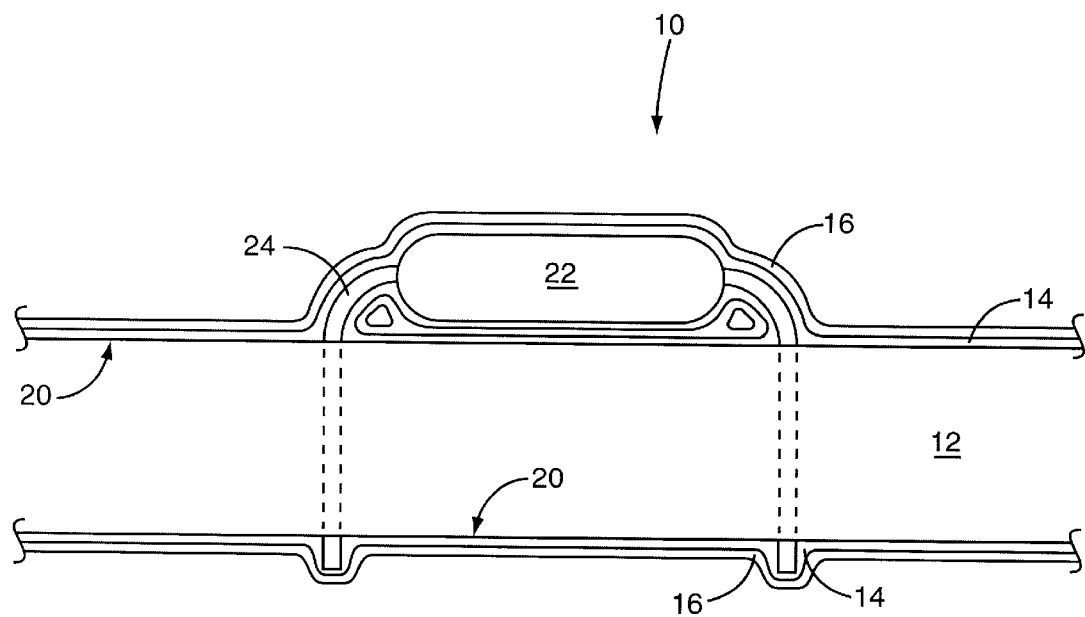
FIG. 1 is an enlarged sectional view of a conformally coated printed circuit board according to the present invention.

It will be understood that the illustration is for the purpose of describing a preferred embodiment of the invention and is not intended to limit the invention thereto. FIG. 1 shows a conformally coated printed circuit board, generally designated 10, including a typical printed circuit board 12 with regular or surface-mount electronic components 22 mounted thereon. The components 22 generally include leads 24 for mounting and providing electrical connection of the components 22 to the printed circuit board 12. After components 22 are mounted to the printed circuit board 12, the "stuffed" board is thoroughly cleaned to remove possible contaminants and solder residue.

After cleaning, a first coating layer 14 is deposited on most, and preferably all, of the printed circuit board surfaces 20, component surface 22 and lead surfaces 24 that may be potentially exposed to air, moisture or water. Although depositing the first coating layer 14 on all surfaces may be impractical or impossible, efforts should be made to maximize coverage. Board cleaning and coating compositions are discussed in detail below. A second coating layer 16 is deposited onto the first coating layer 14, thereby providing a continuous, conformal, stratified coating 14, 16 which is sealed and corrosion resistant over the surface of the board, components and respective leads.

Experiments have shown that the printed circuit board must be cleaned to an extent greater than that set by MIL specifications, which are 20 micrograms per square inch NaCl equivalent. Providing an ultra-clean circuit board which is cleaned to approximately about less than 20 micrograms per square inch NaCl equivalent, and more preferably approximately about less than 5 micrograms per square inch NaCl equivalent, ensures complete and consistent bonding of the first coating layer to the ultra-clean printed circuit board while removing contaminants likely to lead to corrosion and/or dendritic growths. The method of cleaning selected will be affected by the flux used in soldering to the board, as will be apparent to those of ordinary skill in the art. Experimentation has determined that cleaning after using "no-clean" or "aqueous" flux for soldering provides the best results. Complete and consistent bonding are critical to minimizing delamination and cracks in the first coating 14. Therefore, providing an ultra-clean surface to which the first coating layer is applied is an important aspect of the present invention. The following table illustrates the relationship between board surface cleanliness and conformal coating application effectiveness.

| Board Surface Cleanliness | Effectiveness (1–5 scale) |
|---|---|
| 20 μg NaCl equivalent | 1 |
| 10 μg NaCl equivalent | 3 |
| 5 μg NaCl equivalent | 4 |
| 2 μg NaCl equivalent | 5 |
| 1 μg NaCl equivalent | 5 |

In the preferred embodiment, the first coating layer comprises a material generally selected from the group consisting of parylene, urethane, acrylic, epoxy, and silicone-based resins. Most preferably, the first coating layer comprises parylene, which provides a bonded coating that will not delaminate from the printed circuit board or parts mounted thereto. The chemical composition of parylene is $C_{16}H_{14}C_{12}$. Furthermore, the use of parylene allows for board repair, via partial coating removal and redeposition, as necessary. The first coating 14 is preferably vacuum deposited on the ultra-clean circuit board and components mounted thereon to maximize coverage of board, component and lead surfaces while providing uniform deposition.

Also in the preferred embodiment, the second coating layer comprises a corrosion inhibiting viscous fluid which fills in the gaps, movable areas and flexible openings occurring in the first coating layer due to variations or openings in the first layer or openings caused by board topography or component configuration, such as openings or areas associated with movable parts and switches. After application of the first coating 14, the "stuffed" board is preferably dipped in the corrosion-inhibiting viscous fluid, which forms a viscous layer which seals the first coating 14 and any areas of possible penetration left thereby. Notably, the first and second coating also function to filter out contaminants in water that may ultimately reach a board, component, or lead surface. In most cases, the contaminants are more harmful than the water.

The corrosion inhibitor generally comprises a mixture of high molecular weight (HMW) compounds and low molecular weight (LMW) compounds. The low molecular weight compounds are volatile and act as a carrier to distribute the high molecular weight compounds over all surfaces and into the cracks and crevices within these surfaces. During a curing process, the LMW compounds evaporate leaving behind the HMW compounds, which have a very low vapor pressure and as a result remain flexible for extended periods of time and provide continuous coverage. The preferred corrosion inhibiting viscous fluid is manufactured by Elektro-tech and sold under the brand name Elektro-tech B Super-core.

Furthermore, the coating disclosed and claimed herein substantially minimizes the risk of water penetrating the coating layer so as to form a connection with and between the component leads. Sometimes gaps are formed by drilling or machining after application of the parylene. The corrosion inhibiting viscous fluid is capable of withstanding corrosive environments and provides a sealed final coating.

The second coating layer 16 operates in conjunction with the first coating layer 14 to provide a continuous, stratified coating which conforms to the circuit board and components thereon. After cleaning and application of the coatings 14,16, the "stuffed" board is sealed, delamination resistant, and corrosion resistant.

Certain modifications and improvements will occur to those skilled in the art upon reading the foregoing description. It should be understood that all such modifications and improvements have been deleted herein for the sake of conciseness and readability but are properly within the scope of the following claims.

What is claimed is:

1. A coated electrical circuit board for use in a low power environment, said coated electrical circuit board comprising:
   an ultra-clean printed circuit board and components mounted on said board;
   a first conformal coating applied to said ultra-clean printed circuit board; and
   a second coating applied onto the first conformal coating, wherein said first conformal coating protects said ultra-clean printed circuit board, and said components and leads of said components from corrosion, and wherein the second coating is a corrosion inhibiting viscous fluid.

2. The coated electrical circuit board according to claim 1, wherein the first conformal coating further comprises a material selected from the group consisting of parylene, urethane, acrylics, epoxies and silicones.

3. The coated electrical circuit board according to claim 1, wherein the first conformal coating comprises parylene.

4. The coated electrical circuit board according to claim 1, wherein the first conformal coating is vacuum deposited onto the ultra-clean printed circuit board and the multiplicity of components, including the respective component leads.

5. The coated electrical circuit board according to claim 1, wherein the first conformal coating is removable.

6. The coated electrical circuit board according to claim 5 wherein the first conformal coating is redepositable.

7. The coated electrical circuit board according to claim 1, wherein the first conformal coating is directly bonded to the ultra-clean printed circuit board.

8. The coated electrical circuit board according to claim 1, wherein the second coating is a continuous coating layer.

9. The coated electrical circuit board according to claim 1, wherein the second coating fills gaps in said first conformal coating and covers the multiplicity of components and the respective component leads.

10. The coated electrical circuit board according to claim 8, wherein the second coating layer seals the first coating layer.

11. The coated electrical circuit board according to claim 10, wherein the second coating layer is corrosion-resistant.

12. A coated electrical circuit board for use in a low power environment, said coated electrical circuit board comprising:
   an ultra-clean printed circuit board and components mounted on said board; and
   a first conformal coating applied to said ultra-clean printed circuit board,
wherein said first conformal coating protects said ultra-clean printed circuit board, and said components and leads of said components from corrosion, and wherein the ultra-clean printed circuit board is cleaned to less than about 20 micrograms per square inch NaCl equivalent.

13. The coated electrical circuit board according to claim 12, wherein the ultra-clean printed circuit board is cleaned to less than about 5 micrograms per square inch NaCl equivalent.

14. An electrical circuit board for use in a low power environment, said electrical circuit board comprising:
   an ultra-clean printed circuit board and a multiplicity of components having respective component leads;
   a first conformal coating applied thereto; and,
   a second coating applied onto said first conformal coating;
wherein said ultra-clean printed circuit board and said multiplicity of components are cleaned to approximately less than about 20 micrograms per square inch NaCl equivalent, and wherein said first conformal coating and said second coating provide a sealed, corrosion-resistant, stratified coating, thereby protecting the ultra-clean printed circuit board and the multiplicity of components and the respective component leads from corrosion and wherein the second coating is a viscous fluid capable of forming a viscous layer over said first conformal coating, said viscous fluid adapted to remain in a viscous state after application.

15. The coated electrical circuit board according to claim 14, wherein the first conformal coating is a material selected from the group consisting of parylene, urethane, acrylics, epoxies and silicones, and the second coating is a corrosion inhibiting viscous fluid.

16. The coated electrical circuit board according to claim 14, wherein the first conformal coating is a material selected from the group consisting of parylene, urethane, acrylics, epoxies and silicones.

17. The coated electrical circuit board according to claim 14, wherein the second coating is a corrosion inhibiting viscous fluid.

18. A coated electrical circuit board for use in a low power environment, said coated electrical circuit board comprising:
   a printed circuit board having components with leads mounted thereto;
   a first coating selected from the group consisting of parylene, urethane, acrylics, epoxies and silicones; and
   a second coating;
   wherein said first coating is applied to said printed circuit board, said components and said leads, and wherein said second coating is applied to said printed circuit board and said first coating, covering said components and said leads and filling in cracks or gaps in said first coating, thereby protecting said printed circuit board, said components and said leads from corrosion and wherein the second coating is a corrosion-inhibiting viscous fluid.

19. The coated electrical circuit board according to claim 18, wherein the printed circuit board is ultra-clean.

20. The coated electrical circuit board according to claim 18, wherein the first coating is parylene.

21. The coated electrical circuit board according to claim 18, wherein the first and second coatings are stratified.

22. The coated electrical circuit board according to claim 18, wherein the first and second coatings form a sealed, corrosion-resistant coating.

* * * * *